United States Patent [19]

Waggener et al.

[11] 4,215,427
[45] Jul. 29, 1980

[54] CARRIER TRACKING APPARATUS AND METHOD FOR A LOGGING-WHILE-DRILLING SYSTEM

[75] Inventors: William N. Waggener; Gene F. Schroeder, both of Sarasota, Fla.

[73] Assignee: Sangamo Weston, Inc., Norcross, Ga.

[21] Appl. No.: 881,461

[22] Filed: Feb. 27, 1978

[51] Int. Cl.² ............................................. G01V 1/40
[52] U.S. Cl. ...................................... 367/83; 340/853; 375/52; 375/79
[58] Field of Search ............ 340/18 LD, 18 P, 18 NC, 340/18 FM, 207 P, 207 R, 186, 187; 325/30, 320, 420; 178/88; 329/104, 122

[56] References Cited

U.S. PATENT DOCUMENTS

| | | | |
|---|---|---|---|
| 3,286,188 | 11/1966 | Castellano | 329/122 |
| 3,626,301 | 12/1971 | Develet | 325/420 |
| 3,659,202 | 4/1972 | Kaneko | 325/320 |
| 3,737,578 | 6/1973 | Matsuo | 325/30 |
| 3,789,355 | 1/1974 | Patton | 340/18 LD |
| 3,820,063 | 6/1974 | Sexton et al. | 340/18 LD |
| 3,890,572 | 6/1975 | Desblanche et al. | 325/320 |
| 4,001,775 | 1/1977 | Seton et al. | 340/18 LD |
| 4,037,171 | 7/1977 | Cordell | 325/320 |
| 4,110,557 | 8/1978 | Huber | 178/88 |
| 4,130,802 | 12/1978 | Nossen et al. | 325/30 |

OTHER PUBLICATIONS

Blair, "A Receiving System . . . Channel," 5/71, pp. 21–27, A.T.R., vol. 5, #1.

*Primary Examiner*—Nelson Moskowitz
*Attorney, Agent, or Firm*—William R. Sherman; Kevin McMahon

[57] ABSTRACT

The disclosure is applicable for use in a logging-while-drilling apparatus for obtaining subsurface measurements during drilling in a fluid-filled borehole. Acoustic carrier waves are generated downhole in the borehole fluid and are PSK modulated in accordance with digital data representative of the measurements. The PSK modulation is obtained by momentarily unidirectionally either decreasing or increasing the frequency of the acoustic carrier signal until either a desired phase lag (for a decrease in frequency) or phase lead (for an increase in frequency) is imparted to the acoustic carrier signal. An uphole receiving subsystem includes transducers for converting the modulated acoustic carrier waves to electronic signals and circuitry for demodulating the electronic signals to recover the measurement information taken downhole. The uphole circuitry includes an improved carrier tracking loop which is useful, for example, in extracting the carrier from the modulated signal, the extracted carrier then being useful in the demodulation operation. The carrier tracking loop has a voltage controlled oscillator having a control terminal and a comparator for generating a control signal by comparing the phase of a signal derived from the received PSK modulated signal to the phase of a signal derived from the output of the voltage controlled oscillator. The control signal is applied to the control terminal of the oscillator. In accordance with an important feature of the invention, the signal applied to the control terminal is compensated as a function of transitions in the received signal to account for the difference between the nominal frequency of the carrier and the average frequency of the received signal. This difference results from the unidirectional nature of the carrier modulation.

23 Claims, 8 Drawing Figures

4A

4B

4C

4D

4E

4F

4G    "O"    "I"    "O"    "O"

4H        "I"        "I"        "O"        "I"

CARRIER TRACKING APPARATUS AND METHOD FOR A LOGGING-WHILE-DRILLING SYSTEM

BACKGROUND OF THE INVENTION

This invention relates to communication systems and, more particularly, to an improved apparatus and method for receiving and interpreting data signals being telemetered to the surface of the earth in a logging-while-drilling system.

Logging-while-drilling involves the transmission to the earth's surface of downhole measurements taken during drilling, the measurements generally being taken by instruments mounted just behind the drill bit. The prospect of continuously obtaining information during drilling with the entire string in place is clearly attractive. Nonetheless, logging-while-drilling systems have not yet achieved widespread commercial acceptance, largely due to problems associated with transmitting the measured information through the noisy and hostile environment of a borehole. Various schemes have been proposed for achieving transmission of measurement information to the earth's surface. For example, one proposed technique would transmit logging measurements by means of insulated electrical conductors extending through the drill string. This scheme, however, requires adaptation of drill string pipes including provision for electrical connections at the drill pipe couplings. Another proposed scheme employs an acoustic wave which would travel upward through the metal drill string, but the obvious high levels of interfering noise in a drill string are a problem in this technique. Another scheme, which appears particularly promising, utilizes a drilling fluid within the borehole as a transmission medium for acoustic waves modulated with the measurement information. Typically, drilling fluid or "mud" is circulated downward through the drill string and drill bit and upward through the annulus defined by the portion of the borehole surrounding the drill string. This is conventionally done to remove drill cuttings and maintain a desired hydrostatic pressure in the borehole. In the technique referred to, a downhole acoustic transmitter, known as a rotary valve or "mud siren", repeatedly interrupts the flow of the drilling fluid, and this causes an acoustic carrier signal to be generated in the drilling fluid at a frequency which depends upon the rate of interruption. The acoustic carrier is modulated as a function of downhole digital logging data. In a phase shift keying ("PSK") modulating technique, the acoustic carrier is modulated between two (or more) phase states. Various coding schemes are possible using PSK modulation. In a "non-return to zero" coding scheme, a change in phase represents a particular binary state (for example, a logical "1"), whereas the absence of a change of phase represents the other binary state (for example, a logical "0"). The phase changes are achieved mechanically by temporarily modifying the interruption frequency of the mud siren to a higher or lower frequency until a desired phase lag (or lead) is achieved, and then returning the mud siren to its nominal frequency. For example, if the nominal frequency of the mud siren is 12 Hz., a phase change of 180° can be obtained by temporarily lowering the frequency of the mud siren to 8 Hz. for 125 milliseconds (which is one period at 8 Hz. and one and one-half periods at 12 Hz.) and then restoring the mud siren frequency to 12 Hz. It is readily seen that a 180° phase shift could also be achieved by temporarily increasing the mud siren frequency for an appropriate period of time (i.e., to obtain a desired phase lead), and then returning to the nominal frequency.

In conventional PSK communications, the carrier phase is conventionally changed in alternate directions (that is, alternating lead and lag) so that the net change in carrier phase over a long period of time is close to zero. In a logging-while-drilling system wherein an electromechanical device, such as a mud siren, is employed to impart acoustic waves to the drilling fluid, it is preferable to effect all phase changes in the same direction (i.e. either all lags or all leads) which results in the technique for driving the mud siren more efficient and straightforward. (For example, if all phase changes are achieved by momentary decreases in frequency, it is never necessary to increase the frequency above the nominal frequency, and less drive power is needed for the mud siren. Also, the control circuitry can be less complex). The term "unidirectional" PSK modulation means this type of modulation wherein all phase changes are in the same direction.

The modulated acoustic signal is received uphole by one or more transducers which convert the acoustic signal to an electrical signal. It is then necessary to recover the digital information which is contained in the modulation of the received signal. Briefly, this is achieved by first processing the received signals to extract the carrier signal. The reconstructed carrier is then used to synchronously demodulate the modulated electrical signal.

In the type of system described, the carrier is generally extracted using a carrier tracking loop circuit. The carrier tracking loop is a phase-locked loop that includes a voltage controlled oscillator ("VCO") which is responsive to error signals resulting from differences between the phase of the signal derived from the VCO and the phase of the carrier signal. Applicants have discovered, however, that the unidirectional nature of the phase modulation in the type of system described above tends to cause a problem in operation of the phase locked loop. In particular, since phase changes are implemented by momentary variation of frequency, error pulses are generated in the phase-locked loop each time a data transition occurs. Since the PSK modulation is unidirectional (i.e., momentary frequency modification is always to a lower frequency or always to a higher frequency) these error pulses always have the same polarity. These error pulses can tend to cause undesirable frequency deviations in the carrier tracking loop.

It is an object of the present invention to provide an improved carrier tracking loop for use in detection in a phase shift keying transmission system of the type wherein modulation is achieved by temporary unidirectional modification of carrier frequency.

SUMMARY OF THE INVENTION

The present invention is particularly applicable for use in a logging-while-drilling apparatus for obtaining subsurface measurements during drilling in a fluid-filled borehole, and particularly to the receiving and uphole processing of these measurements. In an embodiment of the invention, a downhole sensing and transmitting subsystem is provided and includes means mountable on a drill string for obtaining measurement information. Acoustic carrier waves are generated downhole in the borehole fluid, carrier waves typically being generated at a selected relatively low frequency, for example a nominal frequency of 12 Hz. The downhole subsystem further includes means for PSK modulating the generated acoustic carrier waves in accordance with digital data representative of the measurements. The PSK modulation is obtained by momentarily unidirectionally either decreasing or increasing the frequency of the acoustic carrier signal until either a desired phase lag (for a decrease in frequency) or phase lead (for an increase in frequency) is imparted to the acoustic carrier signal. For example, if the acoustic carrier wave is obtained by operating a mud siren to obtain an acoustic carrier at 12 Hz, a phase lag may be obtained by momentarily lowering the frequency of the mud siren to 8 Hz. After the prescribed momentary period (e.g. 125 milliseconds), the frequency of rotation is returned to 12 Hz, but the momentary excursion to a lower frequency will be understood to have imparted a phase lag to the 12 Hz carrier signal with respect to the phase reference the carrier would have had if no frequency variation had been implemented. The uphole receiving subsystem includes transducer means for converting the modulated acoustic carrier waves to electronic signals and means for demodulating the electronic signals to recover the measurement information taken downhole.

In accordance with the invention, there is provided an improved carrier tracking loop which is useful, for example, in extracting the carrier from the modulated signal, the extracted carrier then being useful in the demodulation operation. The carrier tracking loop includes a controlled oscillator having a control terminal, the frequency of the oscillator being determined by a signal applied to the control terminal. Typically, the oscillator will be a voltage controlled oscillator ("VCO") and have a control terminal to which the controlling voltage is applied. A comparator means is provided for generating a control signal by comparing the phase of a signal derived from the received PSK modulated signal to the phase of a signal derived from the output of the controlled oscillator. Further means are provided for applying this control signal to the control terminal of the oscillator. In accordance with an important feature of the invention, means responsive to transitions in the received signal are provided for compensating the signal applied to the control terminal to account for the difference between the nominal frequency of the carrier and the average frequency of the received signal. This difference results from the unidirectional nature of the carrier modulation.

In the preferred embodiment of the invention, the control signal is applied to the control terminal of the oscillator via a loop filter. In this embodiment, the compensating means comprises a pulse generator for generating a short pulse at each transition of the input signal. These generated pulses are then added to the output of the comparator means and the sum signal then is applied to the control terminal of the oscillator. The sum signal serves as a modified or corrected control signal.

Further features and advantages of the invention will become more readily apparent from the following detailed description when taken in conjunction with the accompanying drawings.

DESCRIPTION OF THE PREFERRED EMBODIMENT

Figure 1:
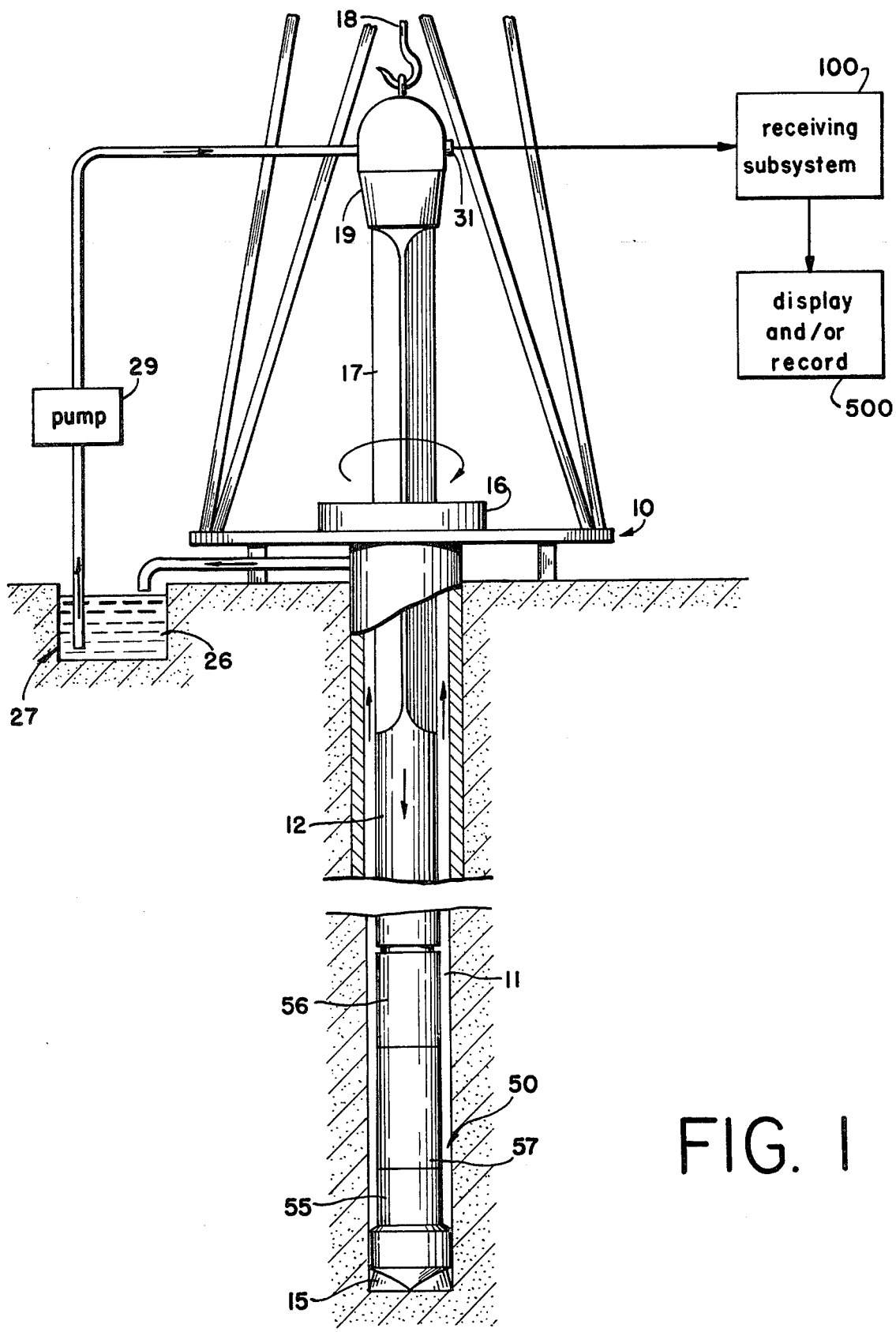
FIG. 1 is a simplified schematic diagram of a logging-while-drilling apparatus which includes the present invention.

Referring to FIG. 1, there is illustrated a simplified diagram of a logging-while-drilling apparatus in accordance with an embodiment of the present invention, as used in conjunction with a conventional drilling apparatus. A platform and derrick 10 are positioned over a borehole 11 that is formed in the earth by rotary drilling. A drill string 12 is suspended within the borehole and includes a drill bit 15 at its lower end. The drill string 12, and the drill 15 attached thereto, is rotated by a rotating table 16 (energized by means not shown) which engages a kelly 17 at at the upper end of the drill string. The drill string is suspended from a hook 18 attached to a travelling block (not shown). The kelly is connected to the hook through a rotary swivel 19 which permits rotation of the drill string relative to the hook. Drilling fluid or mud 26 is contained in a pit 27 in the earth. A pump 29 pumps the drilling fluid into the drill string via a port in the swivel 19 to flow downward through the center of drill string 12. The drilling fluid exits the drill string via ports in the drill bit 15 and then circulates upward in the region between the outside of the drill string and the periphery of the borehole. As is well known, the drilling fluid thereby carries formation cuttings to the surface of the earth, and the drilling fluid is returned to the pit 27 for recirculation. The small arrows in FIG. 1 illustrate the typical direction of flow of the drilling fluid.

Mounted within the drill string 12, preferably near the drill bit 15, is a downhole sensing and transmitting subsystem 50. Subsystem 50 includes a measuring apparatus 55 which may measure any desired downhole condition, for example resistivity, gamma ray, weight on bit, tool face angle, etc. It will be understood, however, that the measuring apparatus 55 can be employed to measure any useful downhole parameter. The transmitting portion of the downhole subsystem includes an acoustic transmitter 56 which generates an acoustic signal in the drilling fluid that is representative of the measured downhole conditions. One suitable type of acoustic transmitter, which is shown in the art, employs a device known as a "mud siren" which includes a slotted stator and a slotted rotor that rotates and repeatedly interrupts the flow of drilling fluid to establish a desired acoustic wave signal in the drilling fluid. Transmitter 56 is controlled by transmitter control and driving electronics 57 which includes analog-to-digital (A/D) circuitry that converts the signals representative of downhole conditions into digital form. The control and driving electronics 57 also includes a phase shift keying (PSK) modulator which produces driving signals for application to the transmitter 56.

Figure 2:
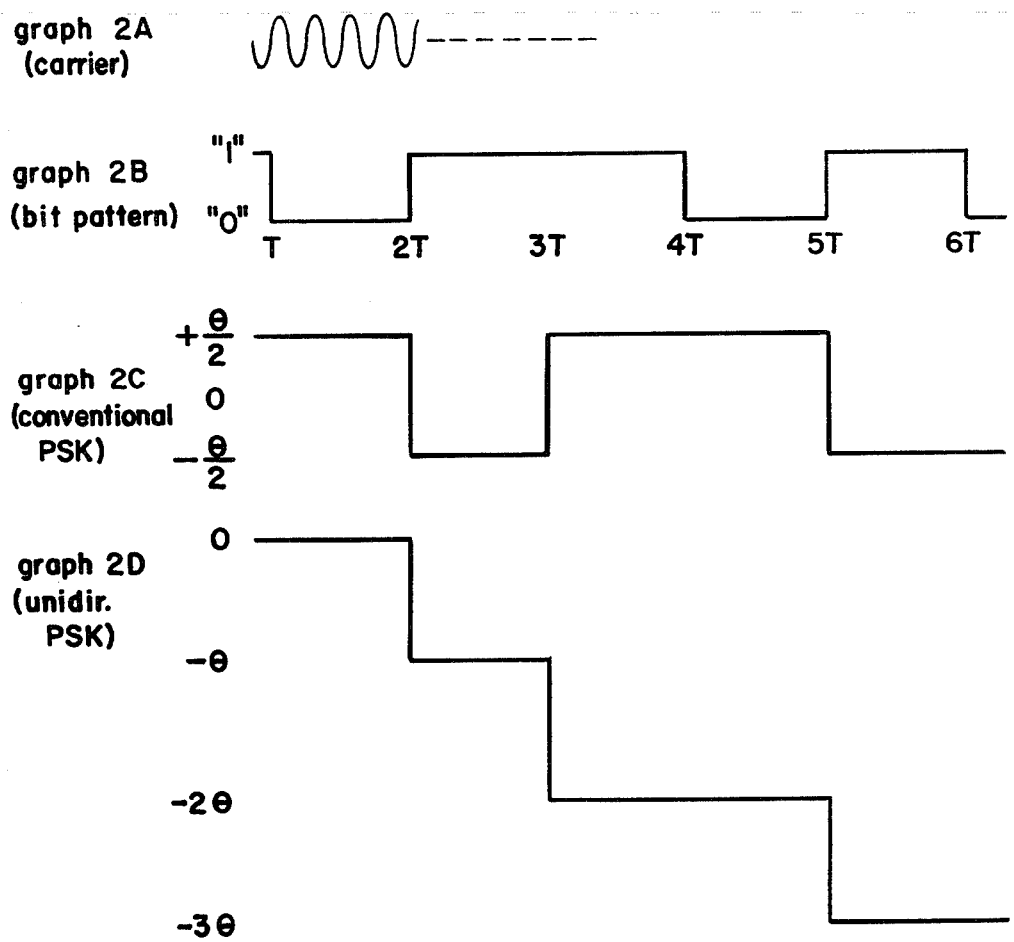
FIG. 2 includes graphs which illustrate conventional PSK modulation and unidirectional ramp phase PSK modulation utilized in the present invention.

In conventional phase shift keyed (PSK) communications, the phase of a carrier signal is changed in accordance with a digital data signal having two or more levels to produce a modulated carrier having two or more phases. The carrier phase is conventionally changed in alternate directions (that is, alternating lead and lag) so that the net change in carrier phase over a long period of time is close to zero. In a logging-while-drilling system wherein an electromechanical device, such as a mud siren, is employed to impart acoustic waves to the drilling fluid, it is preferable to effect all phase changes in the same direction (i.e. either all lags or all leads) which results in the technique for driving the mud siren being more efficient and straightforward. As used herein, the term "unidirectional" PSK modulation is intended to mean this type of modulation wherein all phase changes are in the same direction. Techniques for driving a mud siren to obtain a PSK modulated acoustic carrier wave in drilling fluid, and to obtain unidirectional PSK modulation thereof, are disclosed, for example, in the U.S. Pat. Nos. 3,789,355 and 3,820,063. It will be understood, however, that any suitable means can be employed for obtaining the types of unidirectional PSK modulation described herein. FIG. 2 illustrates the difference between conventional PSK modulation and the unidirectional PSK modulation utilized in a logging-while-drilling system. Graph 2A illustrates an unmodulated carrier signal having a period of T/4 where T is the bit period of the modulating information. An exemplary bit pattern is shown in graph 2B, with "0" to "1" transitions occurring at times 2T and 5T, and "1" to "0" transitions occurring at times T, 4T, and 6T. If a conventional "differentially encoded PSK" coding scheme is employed, a phase change at the bit time epoch (T, 2T, 3T, 4T . . . ) is indicative of a "1" bit, whereas the absence of a phase change at the bit time epoch is indicative of a "0" bit. It will be understood, however, that the opposite convention can be employed, or that any suitable coding scheme could be employed, consistent with the present invention. Accordingly, in graph 2C where conventional PSK modulation is illustrated, a phase change of $\theta$ is implemented each time the next bit is a "1", which means that phase changes are effected at times 2T, 3T and 5T. Thus, graph 2C shows phase changes as being effected at these times, with the phase changes alternating in direction. Graph 2D illustrates the nature of the PSK modulation in an unidirectional PSK modulation as used herein. Phase changes are seen to be effected at the same places, but in this illustrative example each phase change is negative (i.e. resulting in a phase lag) and the phase changes are seen to accumulate.

Referring again to FIG. 1, the generated acoustic wave (i.e., the primary component thereof to be received) travels upward in the fluid through the center of the drill string at the speed of sound in the fluid. The acoustic wave is received at the surface of the earth, by transducers represented by reference numeral 31. The transducers, which may for example be piezoelectric transducers, convert the received acoustic signals to electronic signals. The output of the transducers 31 is coupled to the uphole receiving subsystem 100 which is operative to demodulate the transmitted signals and display the downhole measurement information on display and/or recorder 500.

Figure 3:
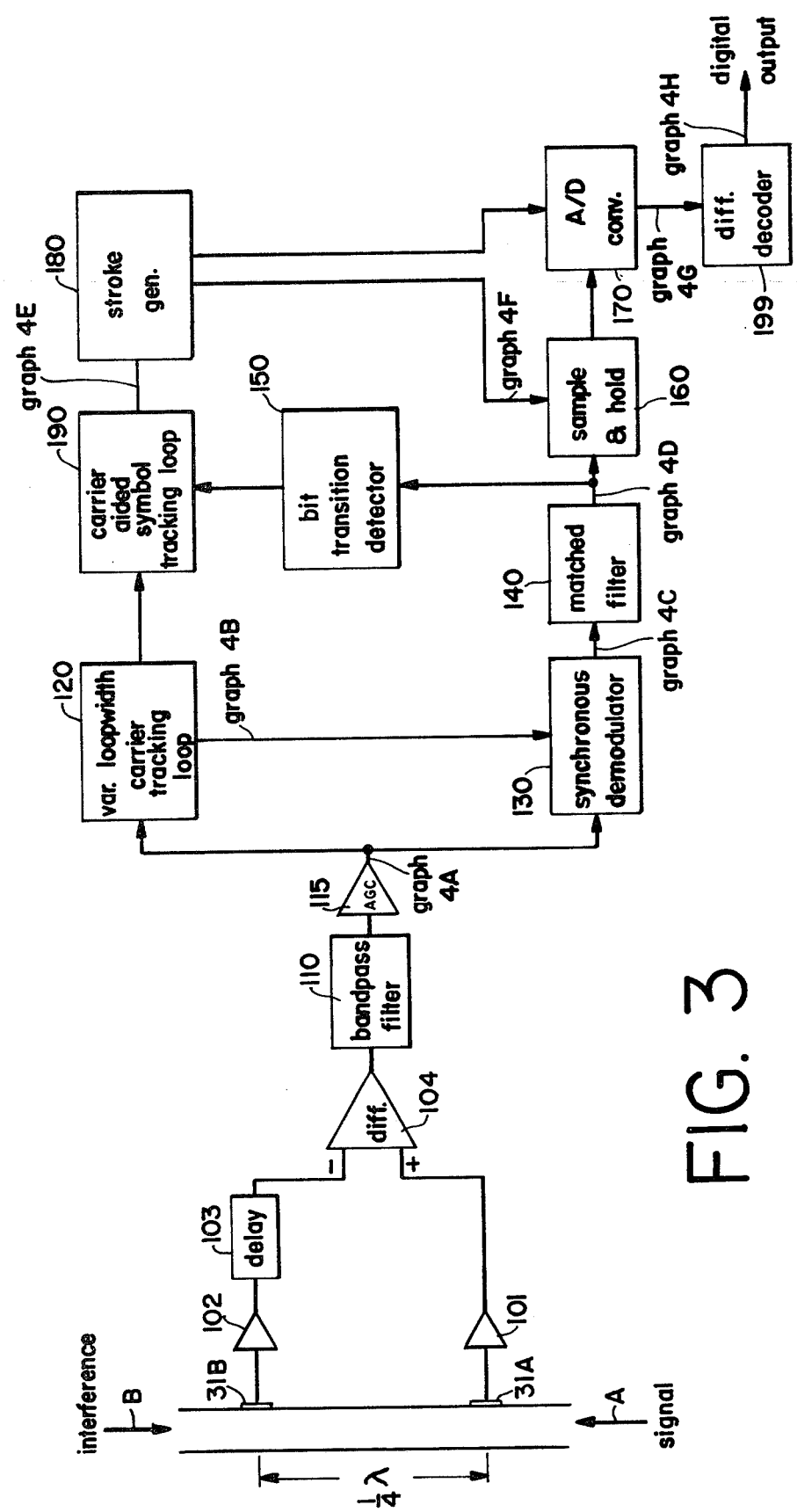
FIG. 3 is a block diagram of the uphole receiving subsystem of the FIG. 1 apparatus.

Referring to FIG. 3, there is shown a block diagram of the uphole receiving subsystem which includes the improved clock correction circuitry in accordance the invention. The waveforms of FIG. 4, which show an exemplary bit pattern "1101" will be referred to from time to time to illustrate operation. The acoustic signals in the borehole fluid are sensed by transducers 31 (FIG. 1) which, in the present embodiment comprises transducers 31A and 31B. In the present embodiment, this pair of transducers is utilized in conjunction with a differential detection arrangement that includes delay 103 and difference amplifier 104. The output of transducer 31B is coupled, via buffer amplifier 102 and delay 103, to the negative input terminal of the difference amplified 104. The transducer 31A is coupled, via buffer amplifier 101, to the positive input terminal of difference amplifier 104. This differential detector arrangement is employed for the purpose of rejecting noise traveling in a direction of propagation that is opposed to that of the primary acoustic carrier wave. For example, if the distance between transducers 31A and 31B is selected as being a quarter wavelength at the carrier frequency, and the delay 103 is also set at a quarter wavelength at the carrier frequency, acoustic waves traveling in the direction of the primary signal (arrow A) will experience a total of one-half wavelength of phase retardation. When the output of delay 103 is subtracted from the undelayed signal from transducer 31A, signals traveling in the direction of arrow A are seen to add in phase. However, acoustic signals traveling in the opposite direction (arrow B) will result in inputs to the differential amplifier 104 that are in phase, thereby resulting in the cancellation of these signals. This is readily seen by recognizing that, in such case, the input to the positive input terminal of differential amplifier 104 experiences a quarter wavelength delay due to the transducer spacing, whereas the input to the negative input terminal of the differential amplifier 104 experiences a quarter wavelength delay due to the electrical delay 103.

The output of differential amplifier 104 is coupled to a bandpass filter 110 which may, for example, be a filter having its center frequency displaced from the nominal carrier frequency and its frequency spectrum asymmetric and skewed toward the lower frequencies, as described in the copending U.S. Patent Application Ser. No. 881,459, filed of even date herewith, and assigned to the same assignee as the present application. As described in the referenced application, the center frequency is offset from the nominal frequency, for example offset from 12 Hz to 11.25 Hz, to better match the asymmetrical signal spectrum caused by unidirectional PSK modulation of the carrier performed at the transmitter.

The output of filter 110 is coupled to an automatic gain control (AGC) amplifier 115 which is provided with a fast-attack slow-release characteristic. The fast-attack mode is useful in achieving stability and sync lock in a minimum time, and the slow release mode maintains the gain during momentary loss or level change of signal. The output of AGC amplifier 115 (shown in idealized form in graph 4A) is coupled to both a synchronous demodulator 130 and variable loopwidth carrier tracking loop 120. The variable loopwidth carrier tracking loop 120 is described in further detail in the copending U.S. Patent Application Ser. No.

881,460, filed of even date herewith and assigned to the same assignee as the present application. As described in the referenced application, the circuit's variable loopwidth can be operated in either a manual or an automatic mode. In the manual mode of operation, the carrier tracking loop will operate in a particular fixed loopwidth (for example, wide, medium or narrow) in accordance with operator selection. These loopwidths may be, for example, 0.3 Hz, 0.1 Hz and 0.03 Hz, respectively, covering a ten to one range. The wide or medium loopwidth will typically be utilized when acquiring lock, and the narrow loopwidth will be switched in once lock has been acquired, so as to enhance the loop stability. In the automatic mode of operation, the loop will initially acquire synchronization using the widest loopwidth (or the medium loopwidth, if so desired under certain conditions). After acquiring synchronization, the loopwidth is switched to a narrower value. When a signal loss occurs, as indicated by an output from a signal loss detector in the circuit 120, the loopwidth is again switched to its widest setting. In either the manual or automatic mode of operation, the variable loopwidth carrier tracking loop may be provided with circuitry for precharging certain capacitors therein which are switched into and out of operation when switching loopwidths. As described in the referenced copending U.S. Patent Application Ser. No. 881,460, this technique is advantageous in preventing possible loss of lock when, for example, switching to a narrower loopwidth, as might be caused by transient voltages resulting from the initial voltages across capacitors that are switched into operation in the circuit.

As described in the referenced copending U.S. Patent Application Ser. No. 881,460 the output of the variable loopwidth carrier tracking loop circuit 120 is derived from the output of a voltage controlled oscillator (VCO) in the phase locked loop of the circuit. This oscillator typically operates at a multiple of the nominal carrier frequency. A clock generator, which includes a frequency divider, therefore derives a clock signal from this VCO output, the derived clock signal (which is illustrated in graph 4B) being at the carrier frequency and in a form suitable for use in demodulating the filtered input signal. The clock correction circuitry in accordance with the invention will be described further hereinbelow, but for present purposes it suffices to indicate that correction pulses are applied to the VCO in the carrier tracking loop in response to data transitions in the received signals.

The output of the carrier tracking loop circuit 120 (graph 4B) is coupled to the synchronous demodulator 130, which, as noted above, receives as its other input the output of AGC amplifier 115 which is to be demodulated. The synchronous demodulator may be, for example, an analog multiplier. Its demodulated output is illustrated by the waveform of graph 4C. The output of the synchronous demodulator 130 is coupled to a matched filter 140. The filter 140 is matched to a square pulse at the bit rate. As is known in the art, the matched filter is operative, upon a data transition at its output, to integrate for a time equal to one bit period. Accordingly, at the end of each bit period, the output of the matched filter is at an extreme positive or negative value (waveform of graph 4D) at which sampling can be most efficiently achieved. Sampling of the output of matched filter 140 is performed by a sample and hold circuit 160 whose output is coupled to an analog-to-digital converter 170 that generates a signal in digital form. (The output of matched filter 140 is also coupled to bit transition detector 150, which may include a zero crossing detector that senses zero crossings of the matched filter output to produce output pulses having a phase which is synchronized with the bit transitions. Use of the transition detector output is referred to directly hereinbelow.) The signal utilized to trigger sampling by the sample and hold circuit 160 and to define the conversion period of the analog-to-digital converter 170 is generated by a strobe generator 180. The sampling signal produced by the strobe generator (waveform of graph 4F) is seen to be at the bit or symbol rate. To obtain this relatively accurate signal at the bit rate, a carrier-aided symbol tracking loop is described in the copending U.S. Patent Application Ser. No. 684,604, assigned to the same assignee as the present application. Briefly, the circuit 190 is a squaring type of phase-locked loop which includes a voltage controlled oscillator and a frequency divider in the loop. In this respect, the circuit is like a conventional bit synchronizer. However, as described in the referenced copending U.S. patent application, in addition to the tracking loop receiving timing information when a transition is detected in the received signal (i.e., the output of bit transition detector 150 in FIG. 3), the output of the carrier tracking loop 120 is also used to aid the symbol tracking loop 190 (output illustrated in graph 4E) during those periods where symbol transitions are absent. This is made possible by the coherent relationship between the carrier and bit rates. If after a number of bit periods there are no bit transitions, a signal derived from the carrier is used to maintain synchronization.

The bit pattern output of A/D converter 170, for this example, is illustrated in graph 4G, and can be seen to result from the sampling of the matched filter output (graph 4D) with the strobe signal (graph 4F) and subsequent A/D conversion. Since the data was originally encoded in conventional "differential encoded PSK" form (as described above), a differential decoder 199 is employed to recover the data in its original form. In particular, since a change in phase was indicative of a "1" in the encoding scheme, a bit change in the output of A/D converter 170 (graph 4G) is interpreted as a "1" by the differential decoder 199. Conversely, the absence of a bit change in the A/D converter output is interpreted as a "0". Accordingly, and as is known in the art, the differential decoder includes an exclusive-OR gate which operates on successively received bits and generates a "1" output when successive bits are different and a "0" output when successive bits are the same. The output of differential decoder 199 is illustrated in FIG. 4H for the present example.

Figure 5:
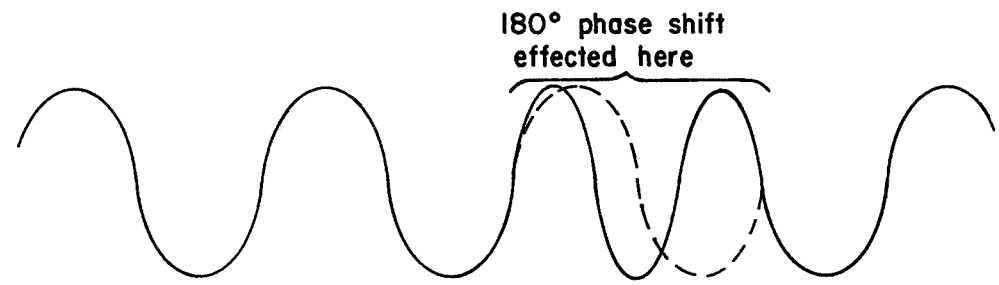
FIG. 5 illustrates the nature of a phase change as implemented in accordance with the PSK modulation of FIG. 2.
Figure 4:
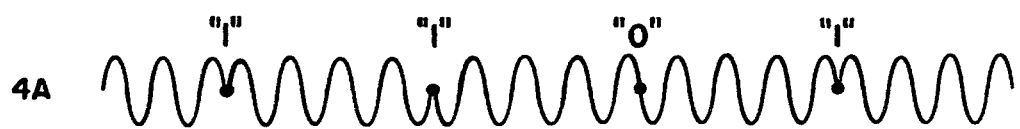
FIG. 4 illustrates idealized waveforms useful in understanding the nature of the signals which appear at various locations of the receiving subsystem circuitry of FIG. 3.
Figure 4:
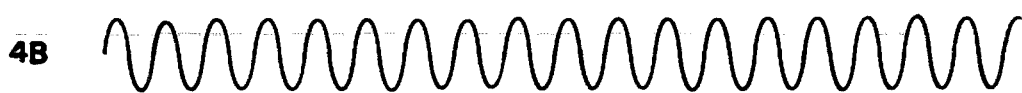
Figure 4:
Figure 4:
Figure 4:
Figure 4:
Figure 4:

It will be understood that in the graph 4A of FIG. 4, the PSK modulation was illustrated in idealized form, with "instantaneous" phase changes, to facilitate understanding of operation of the system of FIG. 3. The actual phase changes are implemented in the manner illustrated in conjunction with graph 2D. FIG. 5 illustrates such a phase change, effected by momentary lowering of the carrier frequency until the desired phase shift is achieved. The dashed line shows what the carrier waveform would look like without the frequency modification.

In an embodiment of the present invention, the carrier frequency is 12 Hz and the bit rate is 1.5 Hz. Unidirectional PSK modulation is implemented by momentarily lowering the carrier frequency to 8 Hz until a 180° phase lag has been achieved, and then restoring the carrier to its nominal 12 Hz frequency. (The desired lag is one-half the period of the nominal carrier frequency. A frequency of 8 Hz has a period which is 1½ times the period of the nominal carrier frequency. Accordingly, after one full cycle at 8 Hz (125 millisec.) the desired phase lag will be obtained. This is readily seen from FIG. 5 wherein the solid line waveform changes to 8 Hz for one cycle while the dashed line waveform illustrates continuation at a 12 Hz frequency. However, since it takes a finite time to change between the two frequencies—and during the transition the average frequency is less than 12 Hz—the actual time spent at 8 Hz is slightly less than 125 ms.). Techniques for driving the mud siren in this manner are known in the art, e.g. in the above-referenced U.S. Pat. Nos. 3,789,355 and 3,820,063.

Figure 6:
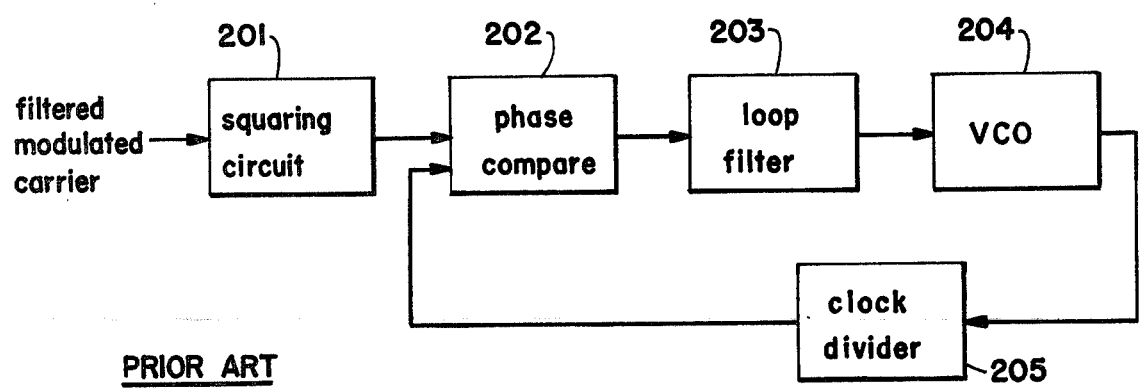
FIG. 6 shows a prior art carrier tracking loop.

Having described the overall receiver subsystem, an important feature of the invention dealing with improvements in the carrier tracking loop (e.g. block 120 of FIG. 3) will now be set forth in further detail. FIG. 6 illustrates a conventional prior art carrier tracking loop circuit. The modulated carrier is first squared by a squaring circuit 201 to destroy the modulation information contained therein. The output of squaring circuit 201 is a signal at about twice the carrier frequency, and is one input to a phase comparator 202. The output of the phase comparator is coupled to a loop filter 203 whose output is, in turn, coupled to the control input terminal of a voltage controlled oscillator (VCO) 204. The output of the VCO is coupled, via a frequency divider (or clock divider) 205, to the other input of phase comparator 202. (It can be noted that the carrier tracking loop is the circuit 120 of FIG. 3. However, applicants have mentioned above that a particular type of variable loopwidth carrier tracking loop, which includes a variable loopwidth filter and is disclosed in the above referenced copending U.S. Pat. Application Ser. No. 881,460, assigned to the same assignee as the present application, can be employed. The principles of the improved carrier tracking loop described herein apply equally well to either fixed or variable loopwidth carrier tracking loops). In operation, and as is well known, once lock is achieved the phase locked loop of FIG. 6 stays locked onto the carrier since phase differences between the generated clock signals (output from clock divider 205) and the received carrier produce an error signal which tends to adjust the VCO frequency to correct any sensed "error". However, as noted in the Background portion hereof, the unidirectional nature of the phase modulation in the type of system described herein tends to cause a problem in operation of the phase locked loop. In particular, since changes are implemented (at data transitions) by momentary variation of frequency (to a lower frequency in the present embodiment), error pulses are generated at the output of the phase comparator each time a data transition occurs. Since the PSK modulation is unidirectional (i.e., momentary frequency modification is always to a lower frequency—as herein—or always to a higher frequency) these error pulses always have the same polarity. Applicants have noted that these error pulses can tend to pull the carrier tracking loop off in frequency.

Figure 7:
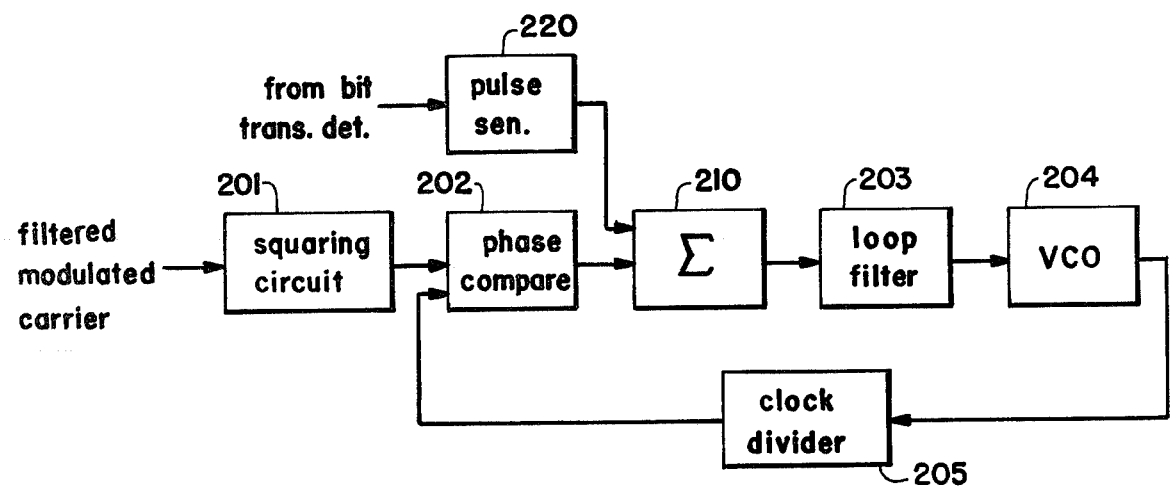
FIG. 7 illustrates an embodiment of an improved carrier tracking loop in accordance with the invention.
Figure 8:
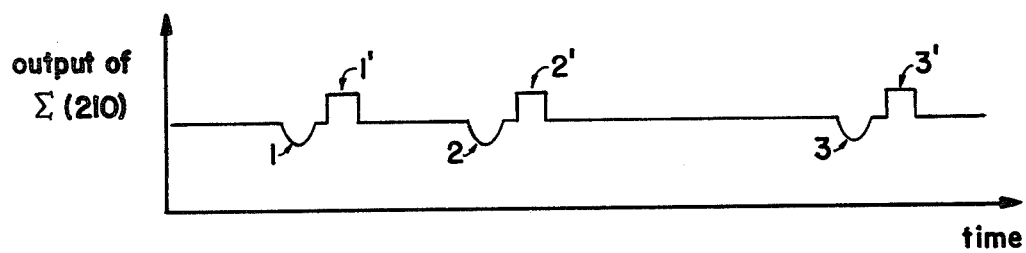
FIG. 8 illustrates the type of waveform produced which is input to the loop filter of the carrier tracking loop of FIG. 6.

FIG. 7 shows an improved carrier tracking loop circuit wherein means responsive to transitions in the received signal are provided for compensating the signal applied to the control terminal of the VCO to account for the difference between the nominal frequency of the carrier and the actual average frequency of the received signal. In FIG. 7, the squaring circuit, phase comparator, loop filter, voltage controlled oscillator, and clock divider all have the same reference numerals as in FIG. 6. In the embodiment of FIG. 7, the output of phase comparator 202 is applied to the loop filter and VCO via a summing circuit 210. The other input to summing circuit 210 receives compensating pulses from a pulse generator 220. The pulse generator 220, which may be a monostable or "one-shot" multivibrator, is triggered by the output of bit transition detector 150 (FIG. 3) and produces a short compensating pulse each time a data transition occurs. In this manner, the effect of the previously described error pulses does not accumulate and cause a frequency drift of the phase locked loop. FIG. 8 shows the waveform which is output from summing circuit 210. The error pulses 1, 2 and 3, which occur at data transitions, are compensated for by the pulses 1', 2' and 3' which are produced by pulse generator 220. The net input to the VCO, resulting from the frequency-modifying nature of the phase modulation, is therefore substantially zero.

The invention has been described with reference to a particular preferred embodiment, but variations within the spirit and scope of the invention will occur to those skilled in the art. For example, the invention is described in the context of a particular receiving system, as illustrated in FIG. 2, but it will be understood that the invention can be employed in other types of receiving systems wherein unidirectional PSK modulated signals are to be processed.

We claim:

1. In an apparatus which receives a PSK signal modulated with digital information and is operative to recover the digital information therefrom, said PSK modulated signal having been modulated with the digital information by momentarily unidirectionally either decreasing or increasing the nominal frequency of a carrier signal as a function of the digital information to effect a phase change; an improved carrier tracking loop circuit, comprising:
   a controlled oscillator having a control terminal, the frequency of said oscillator being determined by a signal applied to said control terminal;
   comparator means for generating a control signal by comparing the phase of a signal derived from the received PSK modulated signal to the phase of a signal derived from the output of said controlled oscillator;
   means for applying said control signal to the control terminal of said oscillator; and
   means responsive to transitions in the received signal for compensating the signal applied to said control terminal to account for the difference between the nominal frequency of said carrier and the average frequency of the received signal which results from the unidirectional nature of the carrier modulation.

2. The circuit as defined by claim 1 wherein said control signal is applied to said control terminal via a loop filter.

3. The circuit as defined by claim 1 wherein said compensating means comprises means for generating a pulse at each data transition of the received signal, and means for adding the generated pulses to said control signal.

4. The circuit as defined by claim 2 wherein said compensating means comprises means for generating a pulse at each data transition of the received signal, and means for adding the generated pulses to said control signal.

5. The circuit as defined by claim 1 further comprising means for squaring the received signal before it is applied to said comparator means.

6. The circuit as defined by claim 2 further comprising means for squaring the received signal before it is applied to said comparator means.

7. The circuit as defined by claim 4 further comprising means for squaring the received signal before it is applied to said comparator means.

8. A logging-while-drilling apparatus for obtaining subsurface measurements during drilling in a fluid-filled borehole and for communicating the measurements to the surface of the earth, comprising:
 a downhole sensing and transmitting subsystem including
  means mountable on a drill string for obtaining measurement information;
  means for generating acoustic carrier waves at a nominal frequency in the borehole fluid;
  means for PSK modulating the generated acoustic carrier waves in accordance with digital data representative of said measurements by momentarily unidirectionally either decreasing or increasing the frequency of said acoustic carrier signal; and
 an uphole receiving subsystem including
  transducer means for converting the modulated acoustic carrier waves to an input electronic signal; and
  a carrier tracking loop circuit which includes a controlled oscillator having a control terminal, the frequency of said oscillator being determined by a signal applied to said control terminal; comparator means for generating a control signal by comparing the phase of a signal derived from said input signal to the phase of a signal derived from the output of said controlled oscillator; means for applying said control signal to the control terminal of said oscillator; and means responsive to transitions in said input signal for compensating the signal applied to said control terminal to account for the difference between the nominal frequency of said carrier and the average frequency of the input signal which results from the unidirectional nature of the carrier modulation; and
  means for recovering the digital data by demodulating said input signal with a signal derived from the output of said controlled oscillator.

9. Apparatus as defined by claim 8 wherein said control signal is applied to said control terminal via a loop filter.

10. Apparatus as defined by claim 8 wherein said compensating means comprises means for generating a pulse at each data transition in the input signal, and means for adding the generated pulses to said control signal.

11. Apparatus as defined by claim 9 wherein said compensating means comprises means for generating a pulse at each data transition in the input signal, and means for adding the generated pulses to said control signal.

12. Apparatus as defined by claim 8 further comprising means for squaring the input signal before it is applied to said comparator means.

13. Apparatus as defined by claim 9 further comprising means for squaring the input signal before it is applied to said comparator means.

14. Apparatus as defined by claim 11 further comprising means for squaring the input signal before it is applied to said comparator means.

15. In a logging-while-drilling apparatus for obtaining subsurface measurements during drilling in a fluid-filled borehole and for communicating the measurements to the surface of the earth, the apparatus including
 a downhole sensing and transmitting subsystem including
  means mountable on a drill string for obtaining measurement information;
  means for generating acoustic carrier waves at a nominal frequency in the borehole fluid;
  means for PSK modulating the generated acoustic carrier waves in accordance with digital data representative of said measurements by momentarily unidirectionally either decreasing or increasing the frequency of said acoustic carrier signal; and
 an uphole receiving subsystem including
  transducer means for converting the modulated acoustic carrier waves to an input electronic signal; and
  means for extracting the digital data from the electronic signals;
 the improvement comprising a carrier tracking loop circuit which includes a controlled oscillator having a control terminal, the frequency of said oscillator being determined by a signal applied to said control terminal; comparator means for generating a control signal by comparing the phase of a signal derived from said input signal to the phase of a signal derived from the output of said controlled oscillator; means for applying said control signal to the control terminal of said oscillator; and means responsive to transitions in the input signal for compensating the signal applied to said control terminal to account for the difference between the nominal frequency of said carrier and the average frequency of the input signal which results from the unidirectional nature of the carrier modulation.

16. The circuit as defined by claim 15 wherein said control signal is applied to said control terminal via a loop filter.

17. The circuit as defined by claim 15 wherein said compensating means comprising means for generating a pulse at each data transition in the input signal, and means for adding the generated pulses to said control signal.

18. The circuit as defined by claim 16 wherein said compensating means comprises means for generating a pulse at each data transition in the input signal, and means for adding the generated pulses to said control signal.

19. The circuit as defined by claim 15 further comprising means for squaring the input signal before it is applied to said comparator means.

20. The circuit as defined by claim 16 further comprising means for squaring the input signal before it is applied to said comparator means.

21. The circuit as defined by claim 18 further comprising means for squaring the input signal before it is applied to said comparator means.

22. For use in conjunction with an apparatus which receives a PSK signal that was modulated with digital information by momentarily unidirectionally either decreasing or increasing the nominal frequency of a carrier signal as a function of the digital information to effect a phase change; said apparatus including a carrier tracking loop circuit for tracking the carrier of the received signal, said carrier tracking loop circuit including a controlled oscillator having a control terminal, the frequency of said oscillator being determined by a signal applied to said control terminal, a comparator for generating a control signal by comparing the phase of a signal derived from the received PSK modulated signal to the phase of a signal derived from the output of said controlled oscillator, and means for applying said control signal to the control terminal of said oscillator; a method of stabilizing operation of the carrier tracking loop circuit, comprising the steps of:

generating compensating pulses in response to transitions in the received signal; and applying said compensating pulses to said control terminal to account for the difference between the nominal frequency of said carrier and the average frequency of the received signal which result from the unidirectional nature of the carrier modulation.

23. For use in conjunction with an apparatus which receives a PSK signal modulated with digital information and is operative to recover the digital information therefrom, the received signal having been modulated with the digital information by momentarily unidirectionally either decreasing or increasing the nominal frequency of a carrier signal; a method of tracking the carrier of the received signal, comprising the steps of:

providing a controlled oscillator having a control terminal, the frequency of said oscillator being determined by a signal applied to the control terminal;

generating a control signal by comparing the phase of a signal derived from the received PSK modulated signal to the phase of a signal derived from the output of said controlled oscillator;

applying said control signal to the control terminal of said oscillator; and applying compensating signals to said oscillator in response to transitions in the received signal, the compensating signals accounting for the difference between the nominal frequency of said carrier and the average frequency of the received signal which results from the unidirectional nature of the carrier modulation.

* * * * *